(12) United States Patent
Hsu

(10) Patent No.: US 12,034,028 B2
(45) Date of Patent: Jul. 9, 2024

(54) SEMICONDUCTOR PACKAGE AND RELATED METHODS

(71) Applicant: SEMICONDUCTOR COMPONENTS INDUSTRIES, LLC, Phoenix, AZ (US)

(72) Inventor: Shou-Chian Hsu, Zhubei (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/659,885

(22) Filed: Apr. 20, 2022

(65) Prior Publication Data

US 2022/0246660 A1 Aug. 4, 2022

Related U.S. Application Data

(63) Continuation of application No. 15/831,697, filed on Dec. 5, 2017, now Pat. No. 11,342,375.

(51) Int. Cl.
*H01L 27/14* (2006.01)
*H01L 27/146* (2006.01)

(52) U.S. Cl.
CPC .. *H01L 27/14632* (2013.01); *H01L 27/14618* (2013.01); *H01L 27/14685* (2013.01); *H01L 27/14687* (2013.01); *H01L 2224/12105* (2013.01); *H01L 2224/13* (2013.01); *H01L 2924/181* (2013.01)

(58) Field of Classification Search
CPC ........... H01L 2924/181; H01L 2224/12; H01L 27/14632; H01L 24/13
See application file for complete search history.

(56) References Cited

U.S. PATENT DOCUMENTS

| | | | | |
|---|---|---|---|---|
| 6,767,753 | B2 * | 7/2004 | Huang | H01L 24/97 257/680 |
| 2010/0003779 | A1 * | 1/2010 | Watanabe | H01L 27/14618 257/E21.499 |
| 2011/0241147 | A1 * | 10/2011 | Tu | H01L 24/97 257/E31.118 |
| 2014/0191350 | A1 | 7/2014 | Chen | |
| 2016/0322273 | A1 | 11/2016 | Wu | |

OTHER PUBLICATIONS

Encapsulated Wafer Level Chip Scale Package for Cost Effective and Robust Solutions in FlexLine, STATChipPAC, EEE International Microsystems, Packaging, Assembly and Circuits Technology Conference (IMPACT), 2014.
Garrou, Phil, "Insights from Leading Edge," Electroiq, Oct. 2016, available at http://electroiq.com/insights-from-leading-edge/2016/10/.

* cited by examiner

*Primary Examiner* — Hoa B Trinh
(74) *Attorney, Agent, or Firm* — Adam R. Stephenson, LTD.

(57) ABSTRACT

Implementations of image sensor packages may include an image sensor chip, a first layer including an opening therethrough coupled to a first side of the image sensor chip, and a optically transmissive cover coupled to the first layer. The optically transmissive cover, the first layer, and the image sensor chip may form a cavity within the image sensor. The image sensor package may also include at least one electrical contact coupled to a second side of the image sensor chip opposing the first side and an encapsulant coating an entirety of the sidewalls of the image sensor package.

20 Claims, 4 Drawing Sheets

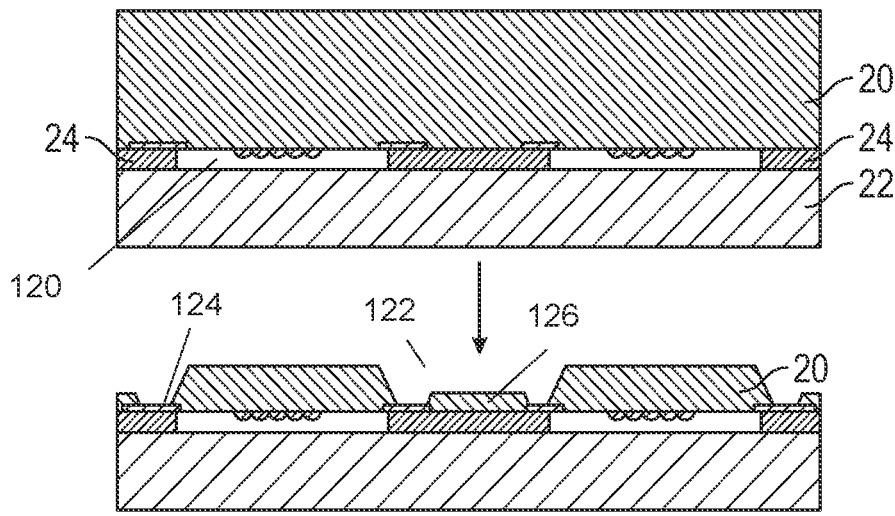
FIG. 3A
FIG. 3B
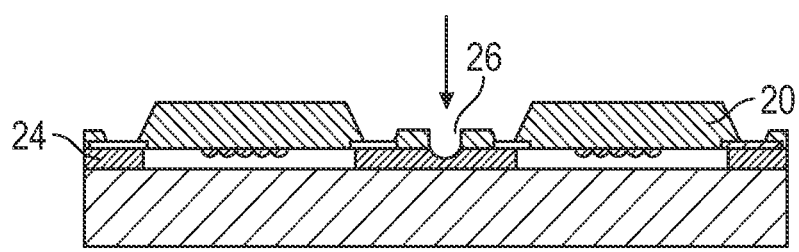
FIG. 3C
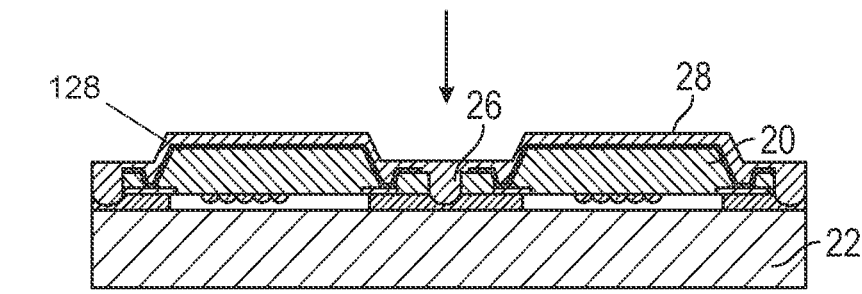
FIG. 3D
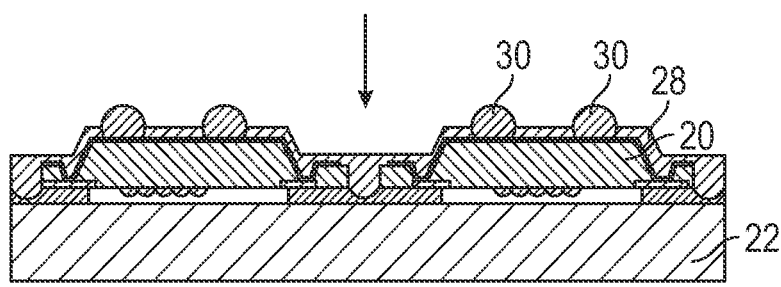
FIG. 3E
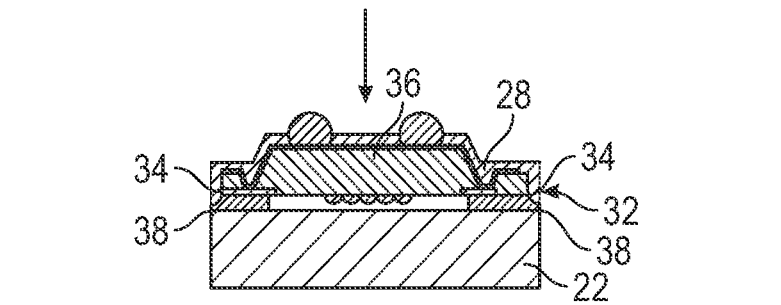
FIG. 3F

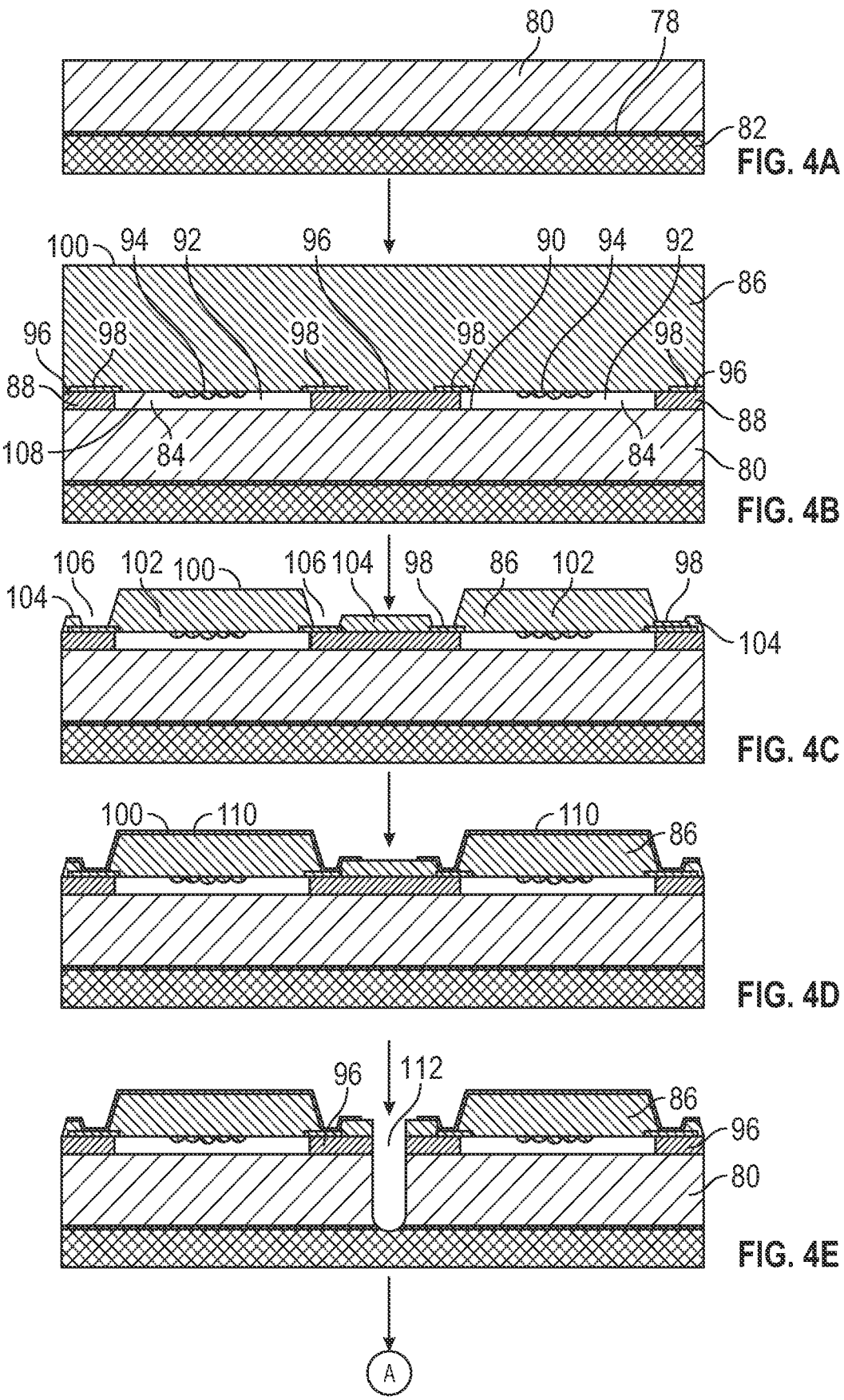

SEMICONDUCTOR PACKAGE AND RELATED METHODS

CROSS REFERENCE TO RELATED APPLICATIONS

This application is a continuation application of the earlier U.S. Utility Patent Application to Hsu entitled "Semiconductor Package and Related Methods," application Ser. No. 15/831,697, filed Dec. 5, 2017, now pending, the disclosure of which is hereby incorporated entirely herein by reference.

BACKGROUND

1. Technical Field

Aspects of this document relate generally to image sensor semiconductor packages, such as a CMOS image sensor chip scale package (CISCSP).

2. Background

Conventionally, image sensor packages have been designed to keep moisture and other contaminants out of the package to ensure proper performance of the image sensor package. Conventionally, a dry film or resin is applied to a glass lid and the glass lid is then attached to the substrate using the dry film or resin to seal the image sensor package. As image sensor packages become increasingly small, the risk of die handling defects increasingly rises, and in turn, the risk of moisture and other contaminants compromising the performance of the image sensor package also increasingly rise.

SUMMARY

Implementations of image sensor packages may include an image sensor chip, a first layer including an opening therethrough coupled to a first side of the image sensor chip, and an optically transmissive cover coupled to the first layer. The optically transmissive cover, the first layer, and the image sensor chip may form a cavity within the image sensor. The image sensor package may also include at least one electrical contact coupled to a second side of the image sensor chip opposing the first side and an encapsulant coating an entirety of the sidewalls of the image sensor package.

Implementations of image sensor packages may include one, all, or any of the following:

A redistribution layer may cover the second side of the image sensor chip.

The encapsulant may include a solder mask.

The at least one electrical contact may be a bump.

The encapsulant may cross all of the interfaces on the sidewalls of the package.

The encapsulant may substantially cover five sides of the package.

Implementations of a method for forming an image sensor package may include coupling a first side of an optically transmissive cover to a carrier and forming a plurality of cavities between the optically transmissive cover and a wafer by coupling a first layer on the wafer to a second side of the optically transmissive cover, the first layer including a plurality of openings therethrough. The method may also include forming a plurality of trenches through a thickness of the optically transmissive cover, filling the plurality of trenches with an encapsulant, and singulating the wafer and the optically transmissive cover into a plurality of image sensor packages by subtractively removing the encapsulant in a portion of the plurality of trenches and removing the carrier.

Implementations of a method for forming an image sensor package may include one, all, or any of the following:

The method may include forming a plurality of trenches through a thickness of the wafer.

The encapsulant may be a solder mask.

Subtractively removing may include one of sawing and etching.

The carrier may be removed through one of heating the carrier and irradiating the carrier with ultra-violet radiation.

The method may include coupling at least one electrical contact to the wafer, wherein the at least one electrical contact extends to an exterior of the image sensor package.

The encapsulant may substantially cover five sides of the image sensor package.

In various implementations, none of the carrier is subtractively removed while forming the plurality of trenches.

Implementations of a method for forming an image sensor package may include coupling a first side of an optically transmissive cover to a carrier, forming a plurality of dams in a first layer on a first side of a wafer, and forming a plurality of cavities between the optically transmissive cover, the wafer, and the dams by coupling the wafer to a second side of the optically transmissive cover. Implementations of a method for forming an image sensor package may also include thinning a second side of the wafer opposite the first side, forming a redistribution layer over the second side of the wafer, and forming a plurality of trenches through a thickness of the wafer and through a thickness of the optically transmissive cover. Implementations of a method for forming an image sensor package may also include covering the second side of the wafer and filling the plurality of trenches with an encapsulant, coupling at least one electrical contact of the redistribution layer, and singulating the wafer and optically transmissive cover into a plurality of image sensor packages by subtractively removing the encapsulant in the plurality of trenches and removing the carrier, wherein the encapsulant coats the sidewall of each image sensor package.

Implementations of a method for forming an image sensor package may include one, all, or any of the following:

In various implementations, none of the carrier is subtractively removed while forming the plurality of trenches.

The encapsulant may be a solder mask.

The encapsulant may substantially cover the plurality of image sensors on five sides of each image sensor.

The method may include forming a plurality of bumps on the wafer.

The method may include removing the carrier through either heating the carrier and/or irradiating the carrier with Ultra-Violet (UV) radiation.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIGS. 3A-3F are illustrations of a process flow for forming the package of FIG. 1; and FIGS. 4A-4J are illustrations of a process flow for forming the package of FIG. 2.

DESCRIPTION

This disclosure, its aspects and implementations, are not limited to the specific components, assembly procedures or method elements disclosed herein. Many additional components, assembly procedures and/or method elements known in the art consistent with the intended image sensor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensor packages, and implementing components and methods, consistent with the intended operation and methods.

This application, as illustrated in FIGS. 1-4, refers to the image sensor package as being a CMOS image sensor chip scale package (CISCSP). It is understood that different elements of the CISCSP and techniques or methods for forming the CISCSP may be applied to other image sensor packages which are not CISCSPs. It is also understood that different elements of the CISCSP and techniques or methods for forming the CISCSP may be applied to other semiconductor packages which are not image sensor packages. Further, the image sensor packages and methods disclosed herein may include any of the elements of the image sensor packages and methods for making the same disclosed in U.S. patent application Ser. No. 15/405,519 to Jin-Wu Weng, entitled "Molded Image Sensor Chip Scale Packages and Related Methods," filed on Jan. 13, 2017, the disclosure of which is hereby incorporated entirely herein by reference.

Figure 1:
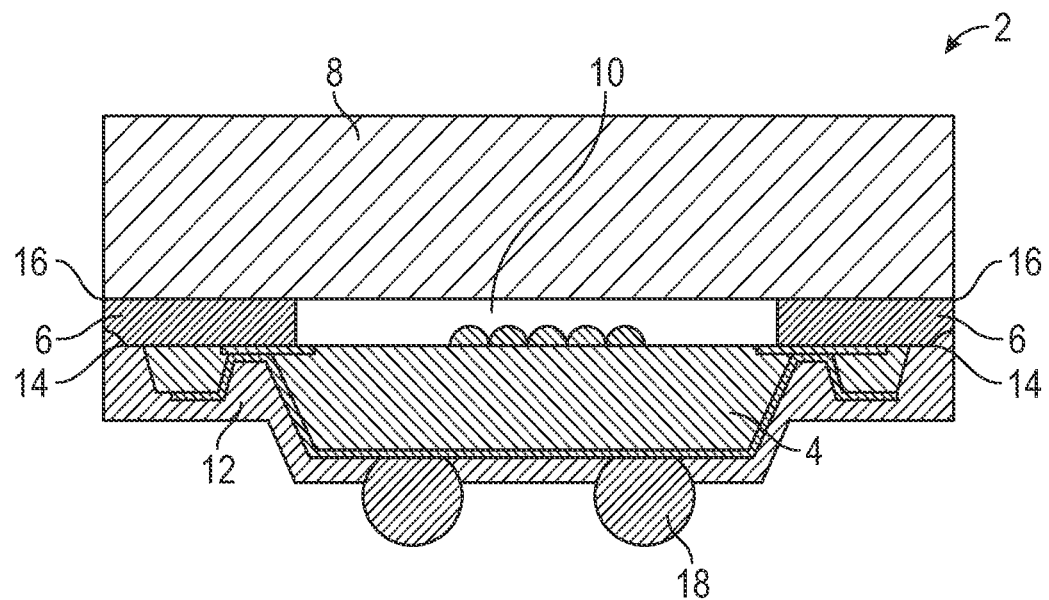
FIG. 1 is a cross sectional side view of a first image sensor package.

Referring specifically to FIG. 1, a cross sectional side view of a first image sensor package is illustrated. The image sensor package 2 includes an image sensor chip 4. The image sensor chip may be the same as or similar to any image sensor chip disclosed herein. A plurality of dams 6 are coupled to the image sensor chip 4 near the sides of the image sensor package 2. These plurality of dams may also be referred to as a single dam with four sides that extend all the way around the chip.

An optically transmissive cover 8 is coupled over the plurality of dams 6 and a cavity 10 is formed between the image sensor chip 4, the plurality of dams 6, and the optically transmissive cover 8. As used herein, optically transmissive may refer to optically transparent or optically translucent. An encapsulant 12 covers a portion of the image sensor package 2. In various implementations, the encapsulant 12 may cover one or more interfaces 14 between the image sensor chip 4 and the plurality of dams 6 on the sidewalls of the package. As a result, the package is sealed to a greater degree as the interfaces between the layers of the plurality of dams 6 and the image sensor chip 4 are less likely to serve as avenues to the image sensor for moisture or contaminants. In various implementations, the encapsulant 12 may only extend along a portion of the outer walls of the plurality of dams 6. In other implementations, the encapsulant extends along an entirety of the outer walls of the plurality of dams 6. In various implementations, the encapsulant does not cover the interface 16 between the plurality of dams 6 and the optically transmissive cover 8, nor does the encapsulant 12 cover any portion of the optically transmissive cover 8. As illustrated, a plurality of electrical contacts 18 may be coupled to the image sensor chip 4 and extend through the encapsulant 12 to an exterior of the package 2. In various implementations, the plurality of electrical contacts 18 may be bumps.

Referring to FIGS. 3A-3F, a process flow for forming the package of FIG. 1 using a wafer scale packaging technique is illustrated. Referring specifically to FIG. 3A, the method includes coupling an optically transmissive cover 22 to a first layer, or plurality of dams, 24. The first layer includes a plurality of openings therethrough which enables the first layer to also be a plurality of dams 24. The method also includes coupling the first layer, or the plurality of dams 24, to a wafer 20. The plurality of dams 24 may reside between the wafer 20 and the optically transmissive cover 22 and a plurality of cavities 120 may be formed by the wafer, the optically transmissive cover, and the plurality of dams 24. In various implementations, the material that becomes the optically transmissive cover 22 following singulation of the packages acts as the carrier that carries the wafer 20 through the entire process.

Referring to FIG. 3B, the wafer 20 may be thinned and patterned. The wafer 20 may be thinned and patterned the same way the wafer of FIGS. 4A-4J is thinned and patterned. Specifically, in various implementations, portions 122 of the wafer may be etched and the electrical routing 124 may be exposed. In various implementations, the portions 122 may include a raised midsection 126. The raised midsection 126 may be used to eventually form an encapsulant lock feature between an encapsulant and a die. In various implementations, the portions 122 may also include sloped sidewalls which may allow for a redistribution layer (RDL) 128 (as illustrated in FIG. 3D) to be formed over the wafer 20 and portions of the wafer 122 and provide an electrical connection between the top of the wafer and the bottom of the wafer through the RDL contacting the electrical routing 124. Referring to FIG. 3C, the method for forming the package of FIG. 1 includes forming a plurality of notches 120 through portions of the wafer 20 and into the plurality of dams 24. In various implementations, each notch is formed through the raised midsections 126. In various implementations, each notch of the plurality of notches 26 ends in the first layer, or a dam of the plurality of dams 24. In other implementations, each notch extends all the way through the first layer, or plurality of dams 24, without extending into the optically transmissive cover 22. When forming the notches 26 through the wafer 20 and the plurality of dams 24, care must be taken to ensure that the optically transmissive cover 22 is not cut into. If the plurality of notches 26 do extend into the optically transmissive cover 22, the optically transmissive cover will likely be damaged and the optically transmissive cover, or carrier, may not be able to withstand the impacts of the remainder of the process of forming the image sensor package of FIG. 1.

Referring to FIG. 3D, the method for forming the image sensor package of FIG. 1 includes applying an encapsulant 28 over the wafer 20 and into the plurality of notches 26. In various implementations, the encapsulant may be a solder mask. In other implementations, the encapsulant may be a mold compound. In implementations with solder mask, the solder mask may allow for protection of the image sensor package at a lower cost than if mold compounds were used. Use of mold compounds may require die reconfiguration and compression molding. However, because of the properties of a solder mask, such as its low viscosity, the application of the solder mask may require less time and cost than application of a mold compound. In implementations where the encapsulant 28 is a solder mask, the solder mask may be applied through liquid spin coating or dry film lamination.

In various implementations, the encapsulant within the plurality of notches directly covers a plurality of interfaces formed between the wafer and the plurality of dams. In various implementations, an etching and plating technique (among other techniques) may be used to create at least one space in the encapsulant 28 which at least one electrical contact 30 extends through. In other implementations, the at least one electrical contact 30 may be pushed through the encapsulant 28 and coupled to the wafer 20 as illustrated in FIG. 3E. The at least one electrical contact 30 is not covered by the encapsulant 28. In various implementations, the one or more electrical contacts 30 may be bumps, studs, pins, wires, or any other electrically conductive structure. Further, in various implementations, the wafer 20 may include any number of electrical contacts 30 and may include any concentration of electrical contacts 30.

The wafer 20, the first layer, and the optically transmissive cover 22 may then be singulated into a plurality of image sensor packages. Each image sensor package 32 may have encapsulant 28 covering a single side of the image sensor package. In various implementations, the encapsulant 28 may also extend down one or more sides of the image sensor package 32 and cover an interface 34 between the plurality of dams 24 and the image sensor chip 36. The encapsulant only extends down the sides of the image sensor package 32 as far as the plurality of notches 26 extended into the wafer 20 and the plurality of dams 24 as illustrated in FIG. 3C.

Figure 2:
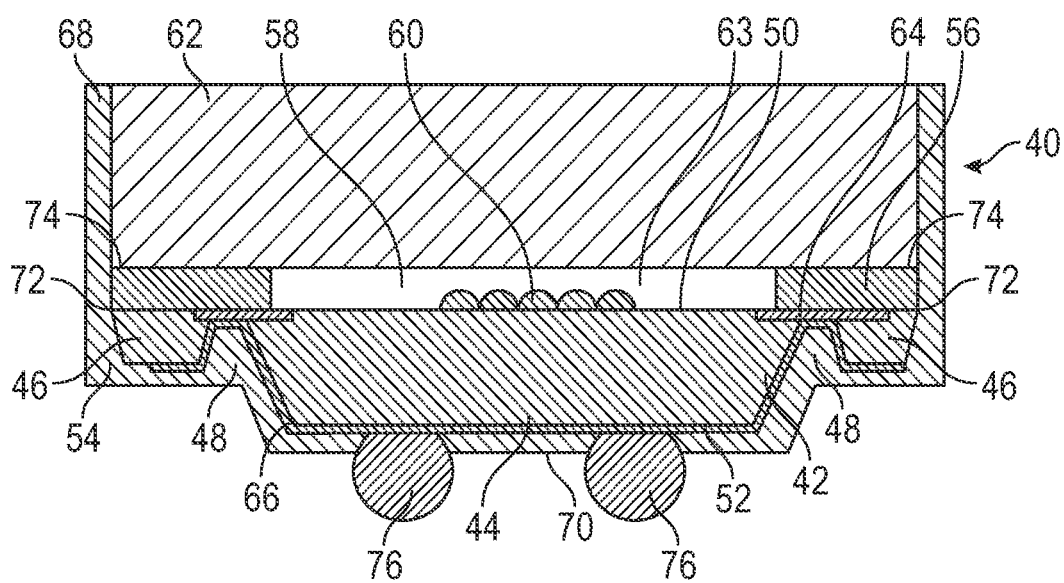
FIG. 2 is a cross sectional side view of a second image sensor package.

Referring to FIG. 2, a cross sectional side view of a second image sensor package is illustrated. Similar to the package of FIG. 1, the image sensor package 40 also includes an image sensor chip 42. The image sensor chip may be of a variety of shapes and sizes. In the implementation illustrated by FIG. 2, the image sensor chip includes a central section 44. The image sensor chip may also include one or more outer sections 46 which may be less thick than the central section 44. In various implementations the image sensor chip 42 includes one or more grooves 48 formed between the central section 44 and the one or more outer sections 46. In various implementations, the grooves 48 may allow for electrical communication between a first side 50 of the image sensor package 42 and a second side 52 of the image sensor package as described later herein. Further, the grooves 48 may allow for an encapsulant 54 to more securely adhere to the image sensor chip 42 as the outer sections 46 of the image sensor chip 42 serve as encapsulant locking mechanisms. In other implementations, the image sensor chip 42 may not include thinner outer portions, rather the image sensor chip 42 may have only a single thickness between the first side 50 and the second side 52 of the image sensor chip 42. The image sensor chip 42 includes an image sensor 60. In various implementations, the image sensor chip 42 may also include electrical routing 64 on the first side 50 of the image sensor chip which electrically couples the image sensor 60 to an outer area of the image sensor chip 42.

The image sensor package 40 includes a first layer 56 coupled to a first side 50 of the image sensor chip 42. The first layer 56 includes an opening 58 therethrough which exposes the image sensor 60 of the image sensor chip 42. The first layer 56 may form a plurality of dams and may be made from any suitable dam material. An optically transmissive cover 62 is coupled to the first layer 56 on the side of the first layer opposing the side of the first layer facing the image sensor chip 42. In various implementations, the optically transmissive cover may be glass, while in other implementations other optically transparent and/or translucent materials may be used. A cavity 63 within the image sensor package 40 is formed between the image sensor chip 42, the optically transmissive cover 62 and the first layer 56. In various implementations, the cavity 63 may be hermetically sealed to reduce the risk of moisture or other contaminants contacting the image sensor 60.

In various implementations, the image sensor package 40 may include a redistribution layer (RDL) 66. In various implementations, the RDL 66 fully covers the second side 52 of the image sensor chip 42, while in other implementations the RDL may only partially cover the second side of the image sensor chip. In various implementations, the RDL 66 may extend into a thinned portion or a groove 48 within the image sensor chip 42 and electrically couple with the routing 64 of the image sensor chip 42. In this manner the first side 50, and in turn the image sensor 60, of the image sensor chip 42 and the second side 52 of the image sensor chip 42 may be electrically coupled to one another. In other implementations, rather than an electrical connection between the first side 50 and the second side 52 of the image sensor chip being formed through the RDL 66 and the routing 64, the first side 50 of the image senor chip 42 may be electrically coupled to the second side 52 of the image sensor chip 42 through one or more through-silicon-vias (TSVs) formed through the image sensor chip 42.

The image sensor package 40 includes an encapsulant 68. In various implementations, the encapsulant 68 may substantially cover five sides of the image sensor package 40 including four side walls and a fifth side 70 of the image sensor package 40. In various implementations, the fifth side 70 is only substantially covered by the encapsulant as the electrical contacts extend through the encapsulant as described later herein. In various implementations, the encapsulant 68 may coat an entirety of the sidewalls of the image sensor package 40, while in other implementations the encapsulant may coat a portion of the sidewalls of the image sensor package 40. As illustrated, the encapsulant 68 crosses all of the interfaces of the various materials of the package that are on the sidewalls of the package. More specifically, the encapsulant crosses and covers the interfaces 72 formed between the image sensor chip 42 and the first layer 56 as well as the interfaces 74 formed between the first layer 56 and the optically transmissive cover 62. Because the encapsulant 68 covers the entirety of the sidewalls, moisture and other contaminants are prevented from entering the cavity 58 through the interfaces. The encapsulant 68 further ensures that the cavity 58 is hermetically sealed to a greater degree than if the interfaces between the optically transmissive cover and the first layer were not covered. Furthermore, the sides of the optically transmissive cover 62 are protected by the encapsulant 68 and the risk of chipping or cracking the optically transmissive cover 62 while forming the package 40 or while handling the package is reduced. In various implementations the encapsulant is a solder mask. In other implementations, the encapsulant may be a mold compound or any other type of encapsulant.

The image sensor package 40 includes one or more electrical contacts 76 coupled to the image sensor chip 42 through the encapsulant 68. The one or more electrical contacts 76 may be configured to electrically couple the image sensor chip 42 to an external device. In implementations with RDL 66, the electrical contacts are coupled to the RDL 66. In implementations where the image sensor 60 is coupled to the second side 52 of the image sensor chip 42 through one or more TSVs, the electrical contacts may be positioned to be coupled to the one or more TSVs.

While the electrical contacts 76 are illustrated as bumps in FIG. 2, in other implementations the electrical contacts may be, by non-limiting example, studs, wires or another type of electrical contact and may include copper, gold, silver, any other metal or combination of metals, or any other electrically conductive material.

Figure 4F:
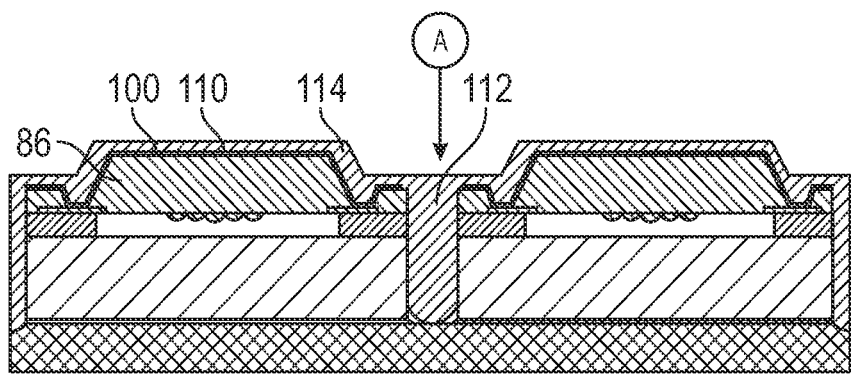

Referring to FIGS. 4A-4J, an implementation of a process flow for forming the package of FIG. 2 is illustrated. Referring specifically to FIG. 4A, an implementation of a method for forming an image sensor package includes coupling a first side 78 of an optically transmissive cover 80 to a carrier 82. The optically transmissive cover 80 may be glass or any other optically transmissive material. In various implementations the carrier 82 may also be glass, while in other implementations the carrier may be made of any other rigid material. In various implementations the optically transmissive cover 80 is bonded to the carrier 82 using an adhesive, while in other implementations the optically transmissive cover 80 may be bonded to the carrier using a different bonding material such as, by non-limiting example, an oxide or a polymer. In implementations where an adhesive is used, the adhesive may be UV releasable tape or a thermal releasing tape.

Referring to FIG. 4B, an implementation of a method for forming an image sensor package includes forming a plurality of cavities 84 between the optically transmissive cover 80 and a wafer 86 by coupling a first layer 88 on the wafer 86 to a second side 90 of the optically transmissive cover 80. The first layer 88 includes a plurality of openings 92 therethrough. The plurality of openings 92 form a plurality of dams 96 coupled between the optically transmissive cover 80 and the wafer 86. The optically transmissive cover 80, dams 96, and the wafer 86 form the plurality of cavities 84. The plurality of openings 92 are positioned to allow a plurality of image sensors 94 to be exposed through the plurality of openings 92. The plurality of image sensors 94 may be coupled to or coupled within the wafer 86.

As illustrated in FIG. 4B, the wafer may also include electrical routing 98. In various implementations, the electrical routing 98 may be configured to contact the first layer 88 when the first layer is coupled to the wafer 86. In this manner, the image sensor may be electrically coupled to the outer portions of the plurality of cavities 84. In other implementations, rather than electrical routing, the wafer 86 may include a plurality of TSVs therein which are configured to electrically couple the plurality of image sensors 94 to a backside, or second side, 100 of the wafer 86 opposing the first side 108 of the wafer with the image sensor. The TSVs may be formed using various methods, such as, by non-limiting example, etching or cutting the wafer and then filling the etches or cuts with a conductive material. In various implementations, the first layer 88 may be coupled to the wafer 86 prior to being coupled to the optically transmissive cover 80, while in other implementations the first layer may be coupled to the optically transmissive cover prior to coupling to the wafer 86.

Referring to FIG. 4C, the backside, or second side, 100 of the wafer 86 may be thinned and/or patterned. The wafer may be thinned to varying thickness and may include varying patterns. In various implementations, portions of the wafer 86 may be completely removed. In various implementations, and as illustrated by FIG. 4C, the wafer 86 may include a plurality of central portions 102 and a plurality of outer portions 104. In various implementations, the outer portions 104 may be thinner than the central portions 102. In various implementations, especially implementations including electrical routing 98 that extends to the plurality of dams, a plurality of grooves 106 may be formed between the central portions 102 and the outer portions 104. Such a groove may provide for a more secure bond to be later formed between the wafer 86 and an encapsulant.

Further, as illustrated by FIG. 4D, an implementation of a method for forming an image sensor package may include forming a RDL 110 over the second side 100 of the wafer 86. The RDL 110 may cover the entirety of the second side 100 of the wafer 86 or may only cover a portion of the second side 100 of the wafer 86. In various implementations, the grooves 106 allow for the RDL 110 to electrically couple to the electrical routing 98. In such implementations, the image sensor 94 located on the first side 108 of the wafer 86 may be electrically coupled to the second side 100 of the wafer 86 through the electrical routing 98 and the RDL 110.

Referring to FIG. 4E, an implementation of a method for forming an image sensor package includes forming a plurality of trenches 112 through a thickness of the optically transmissive cover 80. The trenches 112 are formed through the plurality of dams 96 so as to not interfere with the plurality of cavities 84. In implementations where the wafer 86 or an outer portion 104 of the wafer 86 is located over a dam, the method may also include forming a plurality of trenches 112 through a thickness of the wafer 86. The plurality of trenches may be formed using, by non-limiting example, a saw, a laser, a water jet, plasma etching, deep reactive-ion etching, or chemical etching. The plurality of trenches 112 may include ridges on the sidewalls of the plurality of trenches in order to better secure an encapsulant within the plurality of trenches. In various implementations, the trench extends fully through the optically transmissive cover 86 but does not extend into the material of the carrier 82. In similar implementations, the plurality of trenches extends fully through the optically transmissive cover 86 but does not extend past the first side 78 of the optically transmissive cover 80. Such implementations ensure that the carrier 82 is not compromised through the process of forming the image sensor packages. It also may ensure that there will not be burrs on the faces of the image sensor packages after die pick up as a result of encapsulant filling the trenches 112 that extend into the carrier 82 or past the first side 78 of the optically transmissive cover 80.

Referring to FIG. 4F, implementations for forming an image sensor package include coating or covering the second side 100 of the wafer 86 with an encapsulant 114. In various implementations, the encapsulant completely covers the second side 100 of the wafer 86. In other implementations, the encapsulant 114 does not completely cover the second side 100 of the wafer 86. In such implementations, the encapsulant may include holes therein to allow electrical contacts to contact the RDL 110 or the wafer 86 without the electrical contacts having to be pushed through the encapsulant 114. In implementations with RDL 110, the encapsulant 114 may cover the RDL 110. The encapsulant 114 also fills the plurality of trenches 112, and may completely fill the plurality of trenches 112. The encapsulant 114 may be, by non-limiting example, an epoxy mold compound, an acrylic molding compound, or another type of mold compound capable of providing protection against ingress of contaminants and moisture into the image sensor package. Such a mold compound may be applied using, by non-limiting example, a liquid dispensing technique, a transfer molding technique, a printer molding technique, a film molding technique, a compression molding technique and any other technique for creating solidified mold compound around the wafer 86. In particular implementations, the encapsulant 114 is a solder mask. A solder mask may allow for protection of the image sensor package at a lower cost than if other mold compounds were used. Other mold compounds may require die reconfiguration and compression molding, however, because of the properties of a solder mask, such as its low viscosity, the application of the solder mask may require less time and cost than application of a mold compound. In implementations where the encapsulant 114 is a solder mask, the solder mask may be applied through liquid spin coating or dry film lamination.

Figure 4G:
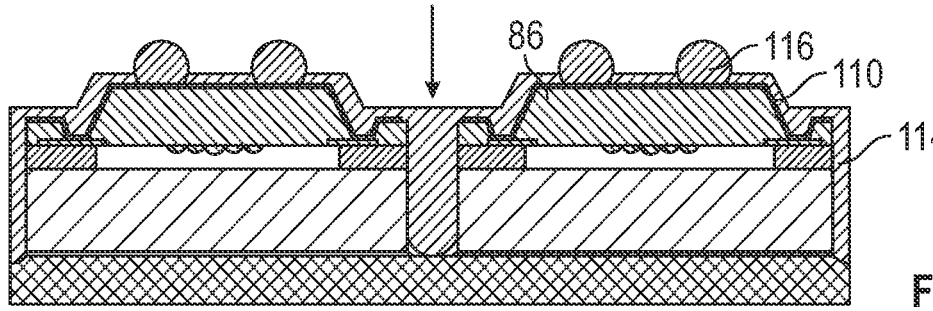

Referring to FIG. 4G, implementations of a method for forming an image sensor package include coupling at least one electrical contact 116 through the encapsulant 114 and to the wafer 86. In various implementations, an etching and plating technique (among other techniques) may be used to create at least one space in the encapsulant 114 which the at least one electrical contact extends through. In other implementations, the at least one electrical contact 116 may be pushed through the encapsulant 114. In various implementations with RDL 110, the electrical contact may couple directly to the RDL 110. In implementations with a plurality of TSVs through the wafer 86, the electrical contacts are electrically coupled to the plurality of TSVs. By electrically coupling the at least one electrical contact to either the RDL 110 or a TSV, the image sensors 94 may be electrically coupled to an exterior of the image sensor package after the image sensor package is formed. In various implementations, the one or more electrical contacts 116 may be bumps, studs, pins, wires, or any other electrically conductive structure. Further, in various implementations, the wafer 86 may include any number of electrical contacts 116 and may include any concentration of electrical contacts 116.

Figure 4H:
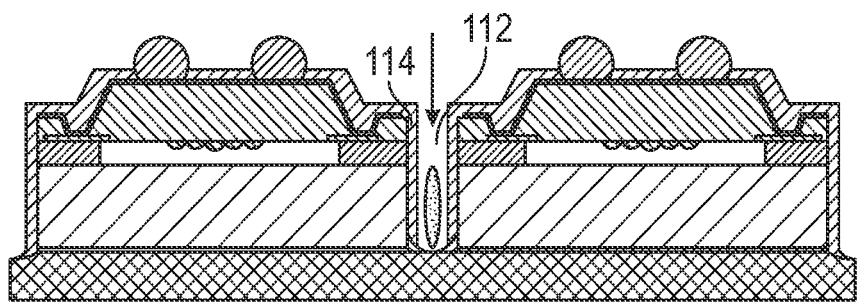

Referring to FIG. 4H, an implementation of a method for forming an image sensor package includes subtractively removing a portion of the encapsulant 114 in the plurality of trenches. The portion removed may be from the middle of the plurality of trenches 112 so that the encapsulant 114 may continue to cover the sidewalls of the plurality of trenches 112. Subtractively removing may be done using, by non-limiting example, a saw, a laser, a water jet, plasma etching, deep reactive-ion etching, or chemical etching. In any event, the method used to subtractively remove the portion of the encapsulant 114 from the plurality of trenches may form a narrower trench through the encapsulant than the width of the plurality of trenches 112. In various implementations, the entire thickness, from the top of the wafer to the bottom of the plurality of trenches, of encapsulant 114 in the plurality of trenches is subtractively removed. Further, in various implementations, a portion of the carrier may also be subtractively removed.

Figure 4I:
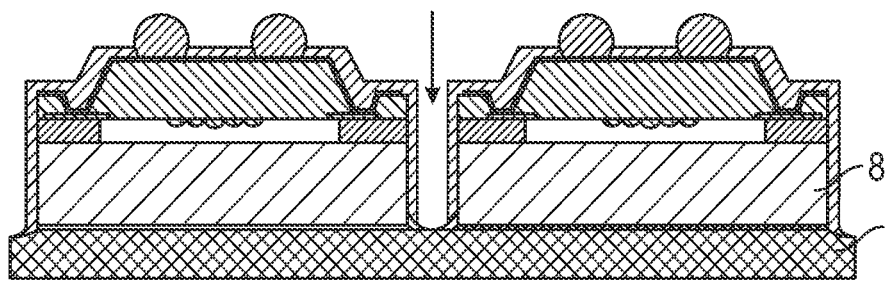

Referring to FIG. 4I, an implementation of a method for forming an image sensor package includes removing the carrier 82 from the optically transmissive cover 80. In implementations where the adhesive bonding the carrier 82 to the optically transmissive cover 80 is UV tape, the carrier may be removed by irradiating the adhesive with ultra-violet radiation. In implementations where the adhesive bonding the carrier 82 to the optically transmissive cover 80 is thermal tape, the carrier may be removed by heating the adhesive. The method of subtractively removing a portion of the encapsulant 114 in the plurality of trenches 112 together with the method of removing the carrier 82 constitute singulating the wafer 86 and the optically transmissive cover 80 into a plurality of image sensor packages.

Figure 4J:
Figure 4J:
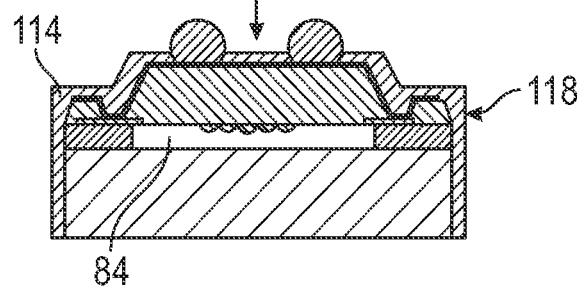

Referring to FIG. 4J, an image sensor package 118 which is the same as the image sensor package of FIG. 2 is produced by the method and process described in relation to FIGS. 4A-4I. The image sensor package 18 includes an encapsulant 114 that substantially covers five sides of the image sensor package. Because the entire sidewalls of the package 118 are covered by the encapsulant 114, the implementations of the method for forming an image sensor package as illustrated in FIGS. 4A-4I result in an image sensor package that has all interfaces on the packages sidewalls covered by the encapsulant 114, including the interfaces formed between the die and the first layer and the interfaces formed between the first layer and the optically transmissive cover. This results in a package that is hermetically or substantially hermetically sealed with a reduced likelihood of moisture or contaminants ever contaminating the cavity 84. Further, the risk of chipping or cracking the optically transmissive cover 80 is reduced as the encapsulant 114 may cover the entirety of the sidewalls of the image sensor package 118.

In places where the description above refers to particular implementations of image sensor packages and implementing components, sub-components, methods and sub-methods, it should be readily apparent that a number of modifications may be made without departing from the spirit thereof and that these implementations, implementing components, sub-components, methods and sub-methods may be applied to other image sensor packages.

What is claimed is:

1. An image sensor package comprising:
    an image sensor chip;
    a first layer comprising an opening therethrough coupled to a first side of the image sensor chip;
    an optically transmissive cover coupled to the first layer, wherein the optically transmissive cover, the first layer, and the image sensor chip comprise a cavity within the image sensor package;
    at least one electrical contact coupled to a second side of the image sensor chip opposing the first side; and
    an encapsulant coating an entirety of sidewalls of the image sensor package;
    wherein a width of the optically transmissive cover is the same as a width of the first side of the image sensor chip.

2. The package of claim 1, further comprising a redistribution layer covering the second side of the image sensor chip.

3. The package of claim 1, wherein the encapsulant comprises a solder mask.

4. The package of claim 1, wherein the at least one electrical contact is a bump.

5. The package of claim 1, wherein the encapsulant crosses all interfaces on the sidewalls of the package.

6. The package of claim 1, wherein the encapsulant substantially covers five sides of the package.

7. An image sensor package comprising:
    an image sensor chip;
    a first layer comprising an opening therethrough coupled to a first side of the image sensor chip;
    an optically transmissive cover coupled to the first layer, wherein the optically transmissive cover, the first layer, and the image sensor chip comprise a cavity within the image sensor package;
    at least one electrical contact coupled to a second side of the image sensor chip opposing the first side; and
    an encapsulant coating an entirety of the sidewalls of the image sensor package;

wherein a width of the optically transmissive cover is the same as a width of the first side of the image sensor chip;

wherein the image sensor package is formed by forming a plurality of trenches through a thickness of the optically transmissive cover;

wherein the image sensor package is formed by filling the plurality of trenches with the encapsulant; and wherein the image sensor package is formed by subtractively removing the encapsulant in a portion of the plurality of trenches.

8. The package of claim 7, wherein the encapsulant is a solder mask.

9. The package of claim 7, wherein subtractively removing comprises one of sawing and etching.

10. The package of claim 7, wherein the at least one electrical contact extends to an exterior of the image sensor package.

11. The package of claim 7, wherein the encapsulant substantially covers five sides of the image sensor package.

12. The package of claim 7, further comprising a redistribution layer covering the second side of the image sensor chip.

13. The package of claim 7, wherein the at least one electrical contact is a bump.

14. The package of claim 7, wherein the encapsulant crosses all interfaces on the sidewalls of the package.

15. An image sensor package comprising:
   an image sensor chip;
   a first layer comprising an opening therethrough coupled to a first side of the image sensor chip;
   an optically transmissive cover coupled to the first layer, wherein the optically transmissive cover, the first layer, and the image sensor chip comprise a cavity within the image sensor package;
   at least one electrical contact coupled to a second side of the image sensor chip opposing the first side; and
   an encapsulant coating an entirety of the sidewalls of the image sensor package;
   wherein a width of the optically transmissive cover is the same as a width of the first side of the image sensor chip;
   wherein the image sensor package is formed by forming a plurality of trenches entirely through a thickness of the first layer, entirely through a thickness of the optically transmissive cover, and entirely through a wafer comprising the image sensor chip;
   wherein the image sensor package is formed by filling the plurality of trenches with the encapsulant; and
   wherein the image sensor package is formed by subtractively removing the encapsulant in a portion of the plurality of trenches.

16. The package of claim 15, wherein the encapsulant comprises a solder mask.

17. The package of claim 15, wherein the encapsulant substantially covers the image sensor chip on five sides.

18. The package of claim 15, further comprising a redistribution layer covering the second side of the image sensor chip.

19. The package of claim 15, wherein the at least one electrical contact is a bump.

20. The package of claim 15, wherein the first layer is directly coupled to the image sensor chip and to a second electrical contact embedded within the image sensor chip.

* * * * *